(12) United States Patent
Lin

(10) Patent No.: US 9,651,588 B2
(45) Date of Patent: May 16, 2017

(54) POWER DETECTING CIRCUIT

(71) Applicant: HON HAI PRECISION INDUSTRY CO., LTD., New Taipei (TW)

(72) Inventor: Ching-Chung Lin, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 52 days.

(21) Appl. No.: 14/488,557

(22) Filed: Sep. 17, 2014

(65) Prior Publication Data

US 2015/0078048 A1  Mar. 19, 2015

(30) Foreign Application Priority Data

Sep. 17, 2013 (CN) .......................... 2013 1 0423410

(51) Int. Cl.
*G01R 21/06* (2006.01)
*G01R 21/00* (2006.01)
*G06F 1/26* (2006.01)

(52) U.S. Cl.
CPC ............. *G01R 21/00* (2013.01); *G01R 21/06* (2013.01); *G06F 1/26* (2013.01)

(58) Field of Classification Search
CPC .......... G01R 21/06; G01R 21/00; G01R 1/26; G01R 22/06; H02M 7/217; H02M 1/42
USPC ................ 323/207, 222; 363/78, 79, 80, 89; 324/119, 120
See application file for complete search history.

(56) References Cited

U.S. PATENT DOCUMENTS

| | | | | |
|---|---|---|---|---|
| 6,005,789 A * | 12/1999 | Lee | ................... | H02M 3/33515 315/387 |
| 6,459,175 B1 * | 10/2002 | Potega | .................. | B60L 11/185 307/132 M |
| 7,930,118 B2 * | 4/2011 | Vinden | .................. | G01R 22/06 702/64 |
| 7,940,535 B2 * | 5/2011 | Itoh | .................... | H05B 41/2882 315/158 |
| 8,358,943 B2 * | 1/2013 | Kim | ................... | G03G 15/5004 363/74 |
| 8,514,593 B2 * | 8/2013 | Brinlee | ..................... | H01F 3/14 363/21.12 |
| 8,731,731 B2 * | 5/2014 | Nakai | ....................... | G05F 1/10 323/234 |

(Continued)

FOREIGN PATENT DOCUMENTS

CN          201611780 U       10/2010

*Primary Examiner* — Gary L Laxton
*Assistant Examiner* — Kyle J Moody
(74) *Attorney, Agent, or Firm* — Steven Reiss

(57) ABSTRACT

A power detecting circuit for a power supply module is disclosed. The power detecting circuit includes a current detecting module, a micro control unit (MCU), a correcting circuit. The current detecting module is electrically coupled to the power supply module and configured to detect an output current value of the power supply module. The micro control unit (MCU) is electrically coupled to the current detecting module. The correcting circuit is electrically coupled to the MCU and configured to correct the output current value of the power supply module. The MCU is configured to calculate an output power value of the power supply module according to the output current value and a preset output voltage value or a tested output voltage value of the power supply module and display the output power value via a display module.

4 Claims, 4 Drawing Sheets

(56) References Cited

U.S. PATENT DOCUMENTS

| | | | | |
|---|---|---|---|---|
| 9,128,131 | B2 * | 9/2015 | Finch | G01R 21/06 |
| 9,157,941 | B2 * | 10/2015 | Lin | G01R 22/10 |
| 2012/0314463 | A1 * | 12/2012 | Chen | H02M 3/00 363/50 |
| 2013/0057530 | A1 * | 3/2013 | Han | G09G 3/3696 345/211 |
| 2013/0214695 | A1 * | 8/2013 | Sadwick | H05B 33/08 315/224 |
| 2013/0279224 | A1 * | 10/2013 | Ofek | H02M 7/219 363/89 |
| 2014/0085756 | A1 * | 3/2014 | Lin | G05F 1/56 361/18 |
| 2014/0125376 | A1 * | 5/2014 | Kawasoe | G01R 21/133 324/764.01 |
| 2014/0340941 | A1 * | 11/2014 | Jutras | G06F 1/26 363/21.01 |
| 2015/0054489 | A1 * | 2/2015 | Lin | G01R 19/16538 324/76.11 |
| 2015/0054494 | A1 * | 2/2015 | Lin | G06F 1/305 324/123 R |
| 2015/0359040 | A1 * | 12/2015 | Yamamoto | H05B 1/0241 219/216 |

\* cited by examiner

POWER DETECTING CIRCUIT

CROSS-REFERENCE TO RELATED APPLICATIONS

This application claims priority to Chinese Patent Application No. 201310423410.2 filed on Sep. 17, 2013 in the China Intellectual Property Office, the contents of which are incorporated by reference herein.

FIELD

The subject matter herein generally relates to power detecting circuits, and particularly relates to a power detecting circuit for a power supply module.

BACKGROUND

Electronic devices, such as computers or monitors, include a power supply module which can be connected to an alternating current (AC) power source. A typical power supply module converts an AC voltage output from the AC power source to a direct current (DC) voltage. The DC voltages can be supplied to circuits and electronic components of the electronic device.

BRIEF DESCRIPTION OF THE DRAWINGS

Implementations of the present technology will now be described, by way of example only, with reference to the attached figures.

DETAILED DESCRIPTION

Figure 1:
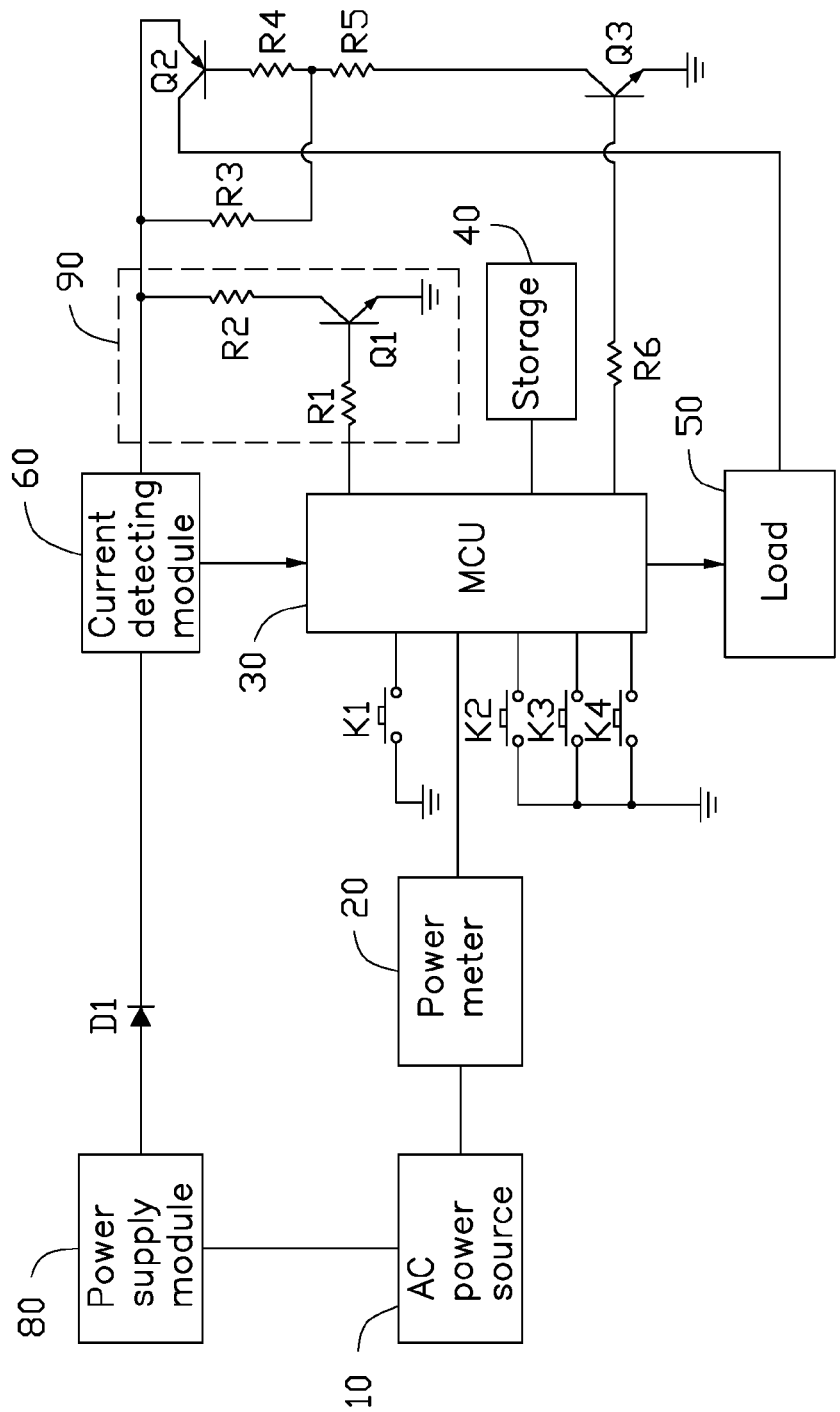
FIG. 1 is a block diagram of a first embodiment of a power detecting circuit.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

FIG. 1 illustrates a power detecting circuit in accordance with a first embodiment. The power detecting circuit can include an alternating current (AC) power source 10, a power meter 20, a micro control unit (MCU) 30, a storage 40, a load 50, a current detecting module 60, a power supply module 80, a correcting circuit 90. The power supply module 80 can convert an AC voltage supplied by the AC power source 70 to DC voltages (e.g., 3.3V, 5V, 12V), which can be fed to electric loads. The power supply module 80 can include a bridge rectifier circuit, a power factor correction module, and a AC-to-DC converting module. The storage 40 can store data received by the MCU 30. In at least one embodiment, the power supply module 80, the MCU 30, the load 50 can be installed on an electronic device.

The power meter 20 is electrically coupled to the AC power source 10 and can detect an input power value of the power supply module 80 which inputted by the AC power source 10. The power meter 20 can further output the input power value to the MCU 30.

The current detecting module 60 can be electrically coupled to the power supply module 80 via a diode D1 and can detect an output current value of the power supply module 80. The current detecting module 60 can further output the output current value to the MCU 30. The power supply module 80 has a preset output voltage value stored in the storage 40. The MCU 30 can calculate an output power value of the power supply module 80 according to the output current value and the preset output voltage value. The MCU 30 can further calculate a conversion efficiency of the power supply module 80 according to the input power value and the output power value. The MCU 30 can further compare the calculate conversion efficiency with a preset conversion efficiency which can indicate the degree of aging of the power supply module 80.

The load 50 may be a display module (e.g., a monitor), and the MCU 30 can display the input power value, the output power value, and the conversion efficiency via the display module.

The correcting circuit 90 can include a first transistor Q1, a first resistor R1, and a second resistor R2. A base terminal of the first transistor Q1 can be electrically coupled to the MCU 30 via the first resistor R1. A collector terminal of the first transistor Q1 can be electrically coupled to the current detecting module 60 via the second resistor R2. An emitter terminal of the first transistor Q1 is grounded. In at least one embodiment, the first transistor Q1 is NPC-type transistor.

The power detecting circuit can further include a second transistor Q2 and a third transistor Q3. An emitter terminal of the second transistor Q2 can be coupled to the current detecting module 60. One terminal of a third resistor R3 can be coupled to the current detecting module 60 and the emitter terminal of the second transistor Q2. Another terminal of the third resistor R3 can be coupled to a base terminal of the second transistor Q2 via a fourth resistor R4. A collector terminal of the second transistor Q2 can be coupled to load 50. One terminal of the fifth resistor R5 can be coupled to the base terminal of the second transistor Q2 via the fourth resistor R4. Another terminal of the fifth resistor R5 can be coupled to a collector terminal of the third transistor Q3. A base terminal of the third transistor Q3 can be coupled to the MCU 30, and an emitter can be grounded. In at least one embodiment, the second transistor Q2 is PNP-type transistor, and the third transistor Q3 is NPN-type transistor.

The power detecting circuit can include a plurality of switches K1~K4. The switch K1 can power on the correcting circuit 90. The switch K2 can power on a power manual correcting function. The switch K3 can power on a increase power correcting function, and the switch K4 can power on a decrease power correcting function.

When the switch K1 is pressed to power on the correcting circuit 90, the MCU 30 can output a high-logic level (e.g., 5V) to the first transistor Q1 and a low-logic level (e.g., 0V) to the third transistor Q3. The first transistor Q1 is switched on, and the second transistor Q2 and the third transistor Q3 are switched off. The load 50 is powered off, and the second resistor R2 is powered on. The current detecting module 60 can detect a current value passing through the second resistor R2 and output the current value to the MCU 30. The MCU 30 can calculate a first output power value of the power supply module 80 when the MCU 30 is electrically coupled to the second resistor R2.

The load 50 is powered on, the correcting circuit 90 is switched off. The MCU 30 can output the low-logic level to the first transistor Q1 and the high-logic level to the third transistor Q3. The first transistor Q1 is switched off, and the second transistor Q2 and the third transistor Q3 are switched on. The current detecting module 60 can detect a current value passing through the load 50 and output the current value to the MCU 30. The MCU 30 can calculate a second output power value of the power supply module 80 when the MCU 30 is electrically coupled to the load 50.

Figure 2:
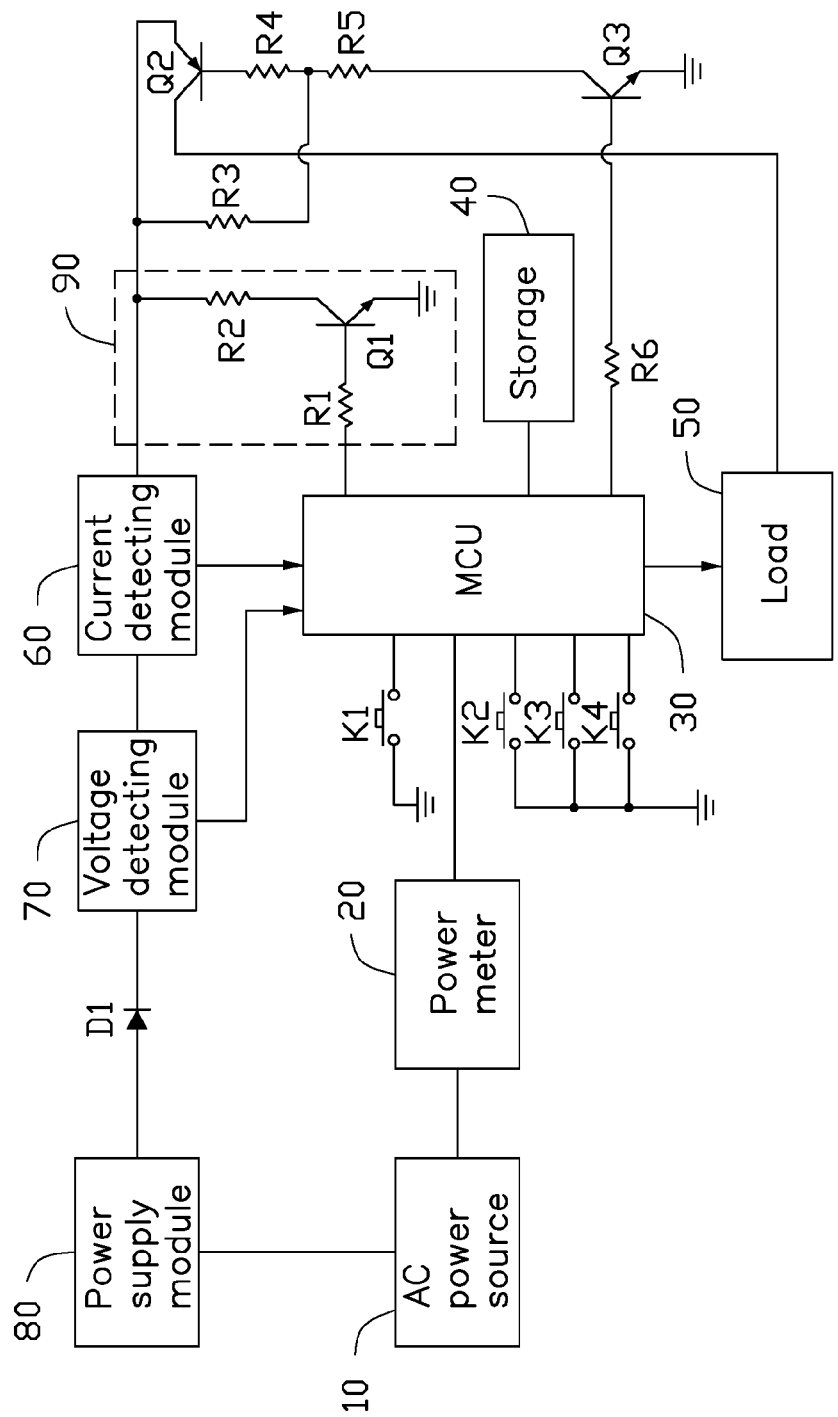
FIG. 2 is a block diagram of a second embodiment of the power detecting circuit.

FIG. 2 illustrates a power detecting circuit in accordance with a second embodiment. The power detecting circuit can include an alternating current (AC) power source 10, a power meter 20, a micro control unit (MCU) 30, a storage 40, a load 50, a current detecting module 60, a voltage detecting module 70, a power supply module 80, a correcting circuit 90. The power supply module 80 can be coupled to the AC power source 10 and can convert an AC voltage supplied by the AC power source 10 to DC voltages (e.g., 3.3V, 5V, 12V), which can be fed to electric loads. The power supply module 80 can include a bridge rectifier circuit, a power factor correction module, and a AC-to-DC converting module. The storage 40 can store data received by the MCU 30. In at least one embodiment, the power supply module 80, the MCU 30, the load 50 can be installed on an electronic device.

The power meter 20 is electrically coupled to the AC power source 10 and can detect an input power value of the power supply module 80 which inputted by the AC power source 10. The power meter 20 can further output the input power value to the MCU 30.

The current detecting module 60 can be electrically coupled to the voltage detecting module 70 and can detect an output current value of the power supply module 80. The current detecting module 60 can further output the output current value to the MCU 30. The power supply module 80 has a preset output voltage value stored in the storage 40. The MCU 30 can calculate an output power value of the power supply module 80 according to the output current value and the preset output voltage value. The MCU 30 can further calculate a conversion efficiency of the power supply module 80 according to the input power value and the output power value. The MCU 30 can further compare the calculated conversion efficiency with a preset conversion efficiency which can indicate the degree of aging of the power supply module 80.

The voltage detecting module 70 can be electrically coupled to the power supply module 80 via a diode D1 and can detect an output voltage value outputted by the power supply module 80. The voltage detecting module 70 can further output the output voltage value to the MCU 30. The MCU 30 can determine if the output voltage value is equal to the preset voltage value which can indicate whether there is a error between the output voltage value and the preset voltage value.

The load 50 may be a display module (e.g., a monitor), and the MCU 30 can display the input power value, the output power value, and the conversion efficiency via the display module.

The correcting circuit 90 can include a first transistor Q1, a first resistor R1, and a second resistor R2. A base terminal of the first transistor Q1 can be electrically coupled to the MCU 30 via the first resistor R1. A collector terminal of the first transistor Q1 can be electrically coupled to the current detecting module 60 via the second resistor R2. An emitter terminal of the first transistor Q1 is grounded. In at least one embodiment, the first transistor Q1 is NPC-type transistor.

The power detecting circuit can further include a second transistor Q2 and a third transistor Q3. An emitter terminal of the second transistor Q2 can be coupled to the current detecting module 60. One terminal of a third resistor R3 can be coupled to the current detecting module 60 and the emitter terminal of the second transistor Q2. Another terminal of the third resistor R3 can be coupled to a base terminal of the second transistor Q2 via a fourth resistor R4. A collector terminal of the second transistor Q2 can be coupled to the load 50. One terminal of the fifth resistor R5 can be coupled to the base terminal of the second transistor Q2 via the fourth resistor R4. Another terminal of the fifth resistor R5 can be coupled to a collector terminal of the third transistor Q3. A base terminal of the third transistor Q3 can be coupled to the MCU 30, and an emitter can be grounded. In at least one embodiment, the second transistor Q2 is PNP-type transistor, and the third transistor Q3 is NPN-type transistor.

The power detecting circuit can include a plurality of switches K1~K4. The switch K1 can power on the correcting circuit 90. The switch K2 can power on a power manual correcting function. The switch K3 can power on a increase power correcting function, and the switch K4 can power on a decrease power correcting function.

When the switch K1 is pressed to power on the correcting circuit 90, the MCU can output a high-logic level (e.g., 5V) to the first transistor Q1 and a low-logic level (e.g., 0V) to the third transistor Q3. The first transistor Q1 is switched on, and the second transistor Q2 and the third transistor Q3 are switched off. The load 50 is powered off, and the second resistor R2 is powered on. The current detecting module 60 can detect a current value passing through the second resistor R2 and output the current value to the MCU 30. The MCU 30 can calculate a first output power value of the power supply module 80 when the MCU 30 is electrically coupled to the second resistor R2.

The load 50 is powered on, the correcting circuit 90 is switched off. The MCU 30 can output the low-logic level to the first transistor Q1 and the high-logic level to the third transistor Q3. The first transistor Q1 is switched off, and the second transistor Q2 and the third transistor Q3 are switched on. The current detecting module 60 can detect a current value passing through the load 50 and output the current value to the MCU 30. The MCU 30 can calculate a second output power value of the power supply module 80 when the MCU 30 is electrically coupled to the load 50.

Figure 3:
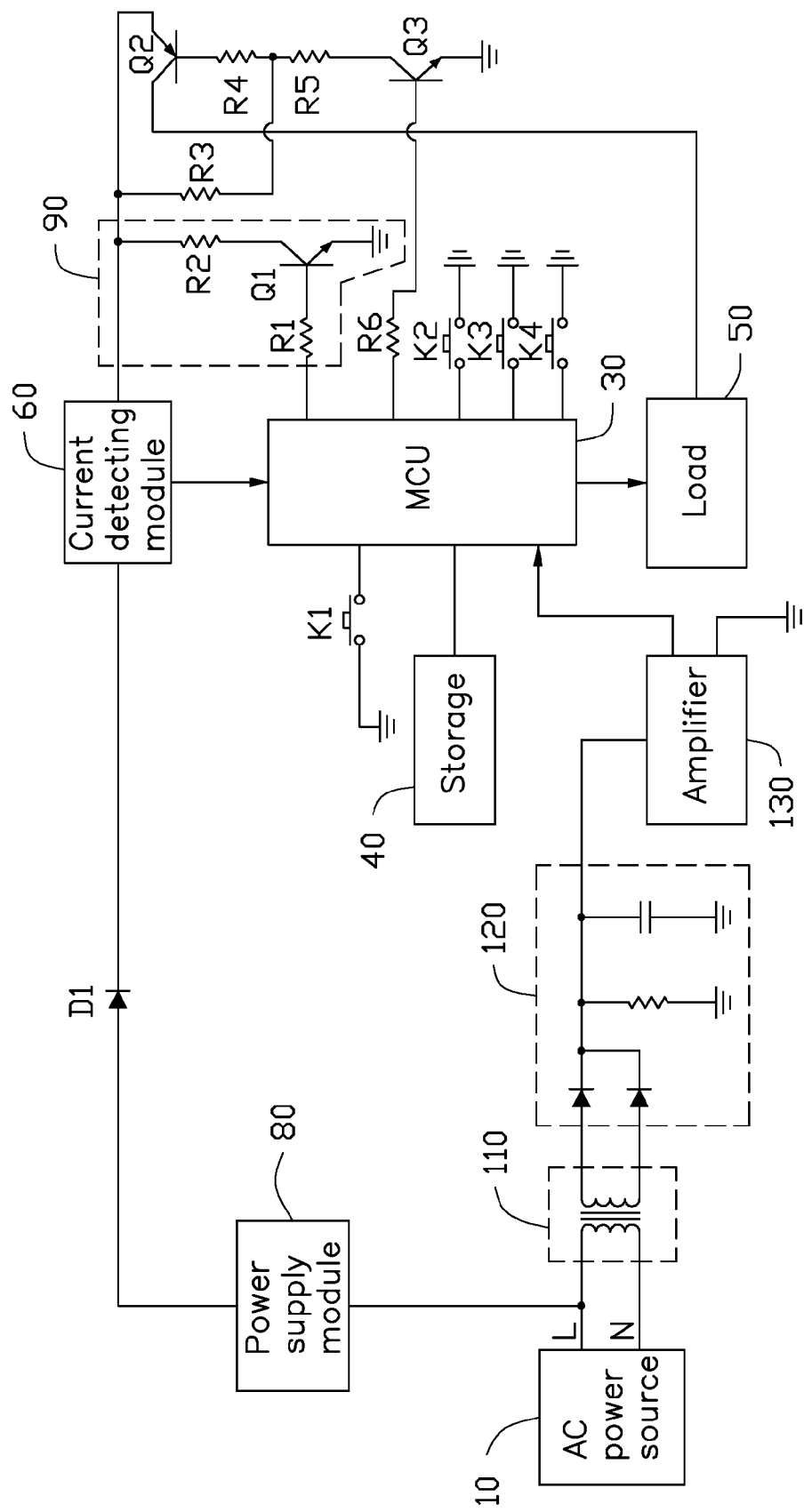
FIG. 3 is block diagram of a third embodiment of a power detecting circuit.

FIG. 3 illustrates a power detecting circuit in accordance with a third embodiment. The power detecting circuit can include an alternating current (AC) power source 10, a micro control unit (MCU) 30, a storage 40, a load 50, a current detecting module 60, a power supply module 80, a correcting circuit 90, a transformer 110, a filter module 120, and an amplifier 130. The power supply module 80 can be electrically coupled to L of the AC power source 10 and can convert an AC voltage supplied by the AC power source 10 to DC voltages (e.g., 3.3V, 5V, 12V), which can be fed to loads. The power supply module 80 can include a bridge rectifier circuit, a power factor correction module, and a AC-to-DC converting module. The storage 40 can storage data received by the MCU 30. In at least one embodiment, the power supply module 80, the MCU 30, the load 50 can be installed on an electronic device.

The transformer 110 can be electrically coupled to the AC power source 10 and can convert the AC voltage supplied by the AC power source 10 to the DC voltage. The filter module 120 can be electrically coupled to the transformer 110 and can filter the DC voltage. The amplifier 130 can be electrically coupled to the filter module 120 and the MCU 30 and can amplify the filtered DC voltage according to a preset ratio. The MCU 30 thereby obtains an input voltage value or an input current value of the AC power source 10.

The current detecting module 60 can be electrically coupled to the power supply module 80 via a diode D1 and can detect an output current value of the power supply module 80. The current detecting module 60 can further output the output current value to the MCU 30. The power supply module 80 has a preset output voltage value stored in the MCU 30. The MCU 30 can calculate an output power value of the power supply module 80 according to the output current value and the preset output voltage value. The MCU 30 can further calculate a conversion efficiency of the power supply module 80 according to the input power value and the output power value. The MCU 30 can further compare the calculate conversion efficiency with a preset conversion efficiency which can indicate the degree of aging of the power supply module 80.

The load 50 may be a display module (e.g., a monitor), and the MCU 30 can display the input power value, the output power value, and the conversion efficiency via the display module.

The correcting circuit 90 can include a first transistor Q1, a first resistor R1, and a second resistor R2. A base terminal of the first transistor Q1 can be electrically coupled to the MCU 30 via the first resistor R1. A collector terminal of the first transistor Q1 can be electrically coupled to the current detecting module 60 via the second resistor R2. An emitter terminal of the first transistor Q1 is grounded. In at least one embodiment, the first transistor Q1 is NPC-type transistor.

The power detecting circuit can further include a second transistor Q2 and a third transistor Q3. An emitter terminal of the second transistor Q2 can be coupled to the current detecting module 60. One terminal of a third resistor R3 can be coupled to the current detecting module 60 and the emitter terminal of the second transistor Q2. Another terminal of the third resistor R3 can be coupled to a base terminal of the second transistor Q2 via a fourth resistor R4. A collector terminal of the second transistor Q2 can be coupled to load 50. One terminal of the fifth resistor R5 can be coupled to the base terminal of the second transistor Q2 via the fourth resistor R4. Another terminal of the fifth resistor R5 can be coupled to a collector terminal of the third transistor Q3. A base terminal of the third transistor Q3 can be coupled to the MCU 30, and a emitter can be grounded. In at least one embodiment, the second transistor Q2 is PNP-type transistor, and the third transistor Q3 is NPN-type transistor.

The power detecting circuit can include a plurality of switches K1~K4. The switch K1 can power on the correcting circuit 90. The switch K2 can power on a power manual correcting function. The switch K3 can power on a increase power correcting function, and the switch K4 can power on a decrease power correcting function.

When the switch K1 is pressed to power on the correcting circuit 90, the MCU can output a high-logic level (e.g., 5V) to the first transistor Q1 and a low-logic level to the third transistor Q3. The first transistor Q1 is switched on, and the second transistor Q2 and the third transistor Q3 are switched off. The load 50 is powered off, and the second resistor R2 is powered on. The current detecting module 60 can detect a current value passing through the second resistor R2 and output the current value to the MCU 30. The MCU 30 can calculate a first output power value of the power supply module 80 when the MCU 30 is electrically coupled to the second resistor R2.

The load 50 is powered on, the correcting circuit 90 is switched off. The MCU 30 can output the low-logic level to the first transistor Q1 and the high-logic level to the third transistor Q3. The first transistor Q1 is switched off, and the second transistor Q2 and the third transistor Q3 are switched on. The current detecting module 60 can detect a current value passing through the load 50 and output the current value to the MCU 30. The MCU 30 can calculate a second output power value of the power supply module 80 when the MCU 30 is electrically coupled to the load 50.

Figure 4:
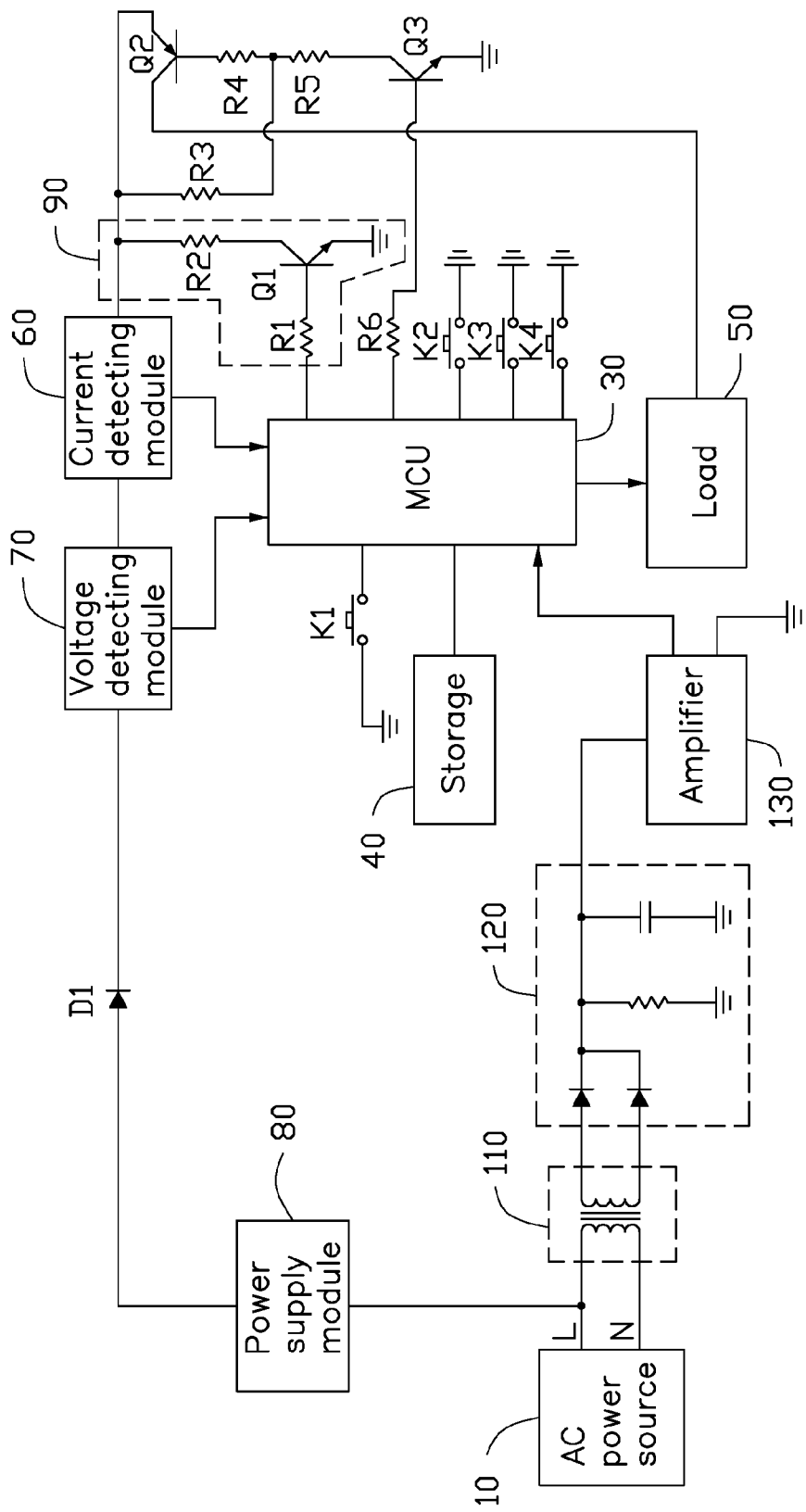
FIG. 4 is block diagram of a fourth embodiment of a power detecting circuit.

FIG. 4 illustrates a power detecting circuit in accordance with a fourth embodiment. The power detecting circuit can include an alternating current (AC) power source 10, a micro control unit (MCU) 30, a storage 40, a load 50, a current detecting module 60, a voltage detecting module 70, a power supply module 80, a correcting circuit 90, a transformer 110, a filter module 120, and an amplifier 130. The power supply module 80 can convert an AC voltage supplied by the AC power source 10 to DC voltages (e.g., 3.3V, 5V, 12V), which can be fed to loads. The power supply module 80 can include a bridge rectifier circuit, a power factor correction module, and a AC-to-DC converting module. The storage 40 can storage data received by the MCU 30. In at least one embodiment, the power supply module 80, the MCU 30, the load 50 can be installed on an electronic device.

The transformer 110 can be electrically coupled to the AC power source 10 and can convert the AC voltage supplied by the AC power source 10 to the DC voltage. The filter module 120 can be electrically coupled to the transformer 110 and can filter the DC voltage. The amplifier 130 can be electrically coupled to the filter module 120 and the MCU 30, and the amplifier 130 can amplify the filtered DC voltage according to a preset ratio. The MCU 30 thereby obtains an input voltage value or an input current value of the AC power source 10.

The current detecting module 60 can be electrically coupled to the voltage detecting module 70 and can detect an output current value of the power supply module 80. The current detecting module 60 can further output the output current value to the MCU 30. The power supply module 80 has a preset output voltage value stored in the MCU 30. The MCU 30 can calculate an output power value of the power supply module 80 according to the output current value and the preset output voltage value. The MCU 30 can further calculate a conversion efficiency of the power supply module 80 according to the input power value and the output power value. The MCU 30 can further compare the calculate conversion efficiency with a preset conversion efficiency which can indicate the degree of aging of the power supply module 80.

The voltage detecting module 70 can be electrically coupled to the power supply module 80 via a diode D1 and can detect an output voltage value outputted by the power supply module 80. The voltage detecting module 70 can further output the output voltage value to the MCU 30. The MCU 30 can determine if the output voltage value is equal to the preset voltage value which can indicate whether there is a error between the output voltage value and the preset voltage value The load 50 may be a display module (e.g., a monitor), and the MCU 30 can display the input power value, the output power value, and the conversion efficiency via the display module.

The correcting circuit 90 can include a first transistor Q1, a first resistor R1, and a second resistor R2. A base terminal of the first transistor Q1 can be electrically coupled to the MCU 30 via the first resistor R1. A collector terminal of the first transistor Q1 can be electrically coupled to the current detecting module 60 via the second resistor R2. An emitter terminal of the first transistor Q1 is grounded. In at least one embodiment, the first transistor Q1 is NPC-type transistor.

The power detecting circuit can further include a second transistor Q2 and a third transistor Q3. An emitter terminal of the second transistor Q2 can be coupled to the current detecting module 60. One terminal of a third resistor R3 can be coupled to the current detecting module 60 and the emitter terminal of the second transistor Q2. Another terminal of the third resistor R3 can be coupled to a base terminal of the second transistor Q2 via a fourth resistor R4. A collector terminal of the second transistor Q2 can be coupled to load 50. One terminal of the fifth resistor R5 can be coupled to the base terminal of the second transistor Q2 via the fourth resistor R4. Another terminal of the fifth resistor R5 can be coupled to a collector terminal of the third transistor Q3. A base terminal of the third transistor Q3 can be coupled to the MCU 30, and an emitter can be grounded. In at least one embodiment, the second transistor Q2 is PNP-type transistor, and the third transistor Q3 is NPN-type transistor.

The power detecting circuit can include a plurality of switches K1~K4. The switch K1 can power on the correcting circuit 90. The switch K2 can power on a power manual correcting function. The switch K3 can power on a increase power correcting function, and the switch K4 can power on a decrease power correcting function.

When the switch K1 is pressed to power on the correcting circuit 90, the MCU can output a high-logic level (e.g., 5V) to the first transistor Q1 and a low-logic level (e.g., 0V) to the third transistor Q3. The first transistor Q1 is switched on, and the second transistor Q2 and the third transistor Q3 are switched off. The load 50 is powered off, and the second resistor R2 is powered on. The current detecting module 60 can detect a current value passing through the second resistor R2 and output the current value to the MCU 30. The MCU 30 can calculate a first output power value of the power supply module 80 when the MCU 30 is electrically coupled to the second resistor R2.

The load 50 is powered on, the correcting circuit 90 is switched off. The MCU 30 can output the low-logic level to the first transistor Q1 and the high-logic level to the third transistor Q3. The first transistor Q1 is switched off, and the second transistor Q2 and the third transistor Q3 are switched on. The current detecting module 60 can detect a current value passing through the load 50 and output the current value to the MCU 30. The MCU 30 can calculate a second output power value of the power supply module 80 when the MCU 30 is electrically coupled to the load 50.

In above embodiments, the power detecting circuit can further include more than one correcting circuit 90 to correct the output current value of the power supply module 80. The correcting circuit 90 is correctable to correct the value of load, and the output power value of the power supply module 80 can be changeable along with the the value of load so that a graph of the load and the output power value can be obtained. A graph can obtain to indicate the conversion efficiency of the power supply according to the input power value and the output power value or according to the input value and the output voltage value The embodiments shown and described above are only examples. Many details are often found in the art such as the other features of a power detecting circuit. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A power detecting circuit for a power supply module, the power detecting circuit comprising
   a current detecting module coupled to the power supply module and configured to detect an output current value thereof;
   a micro control unit (MCU) coupled to the current detecting module;
   a load coupled to the MCU; and
   a correcting circuit coupled to the MCU, the correcting circuit configured to correct the output current value of the power supply module when the load is turned off;
   wherein the MCU is configured to calculate an output power value of the power supply module according to a corrected output current value of the power supply module and a preset output voltage value or a tested output voltage value of the power supply module;
   the load displays the output power value;
   and the correcting circuit comprises a first transistor, a second transistor, and a third transistor; a base terminal of the first transistor is electrically coupled to the MCU via a first resistor, a collector terminal of the first transistor is electrically coupled to the current detecting module via a second resistor, and an emitter terminal of the first transistor is grounded; an emitter terminal of the second transistor is electrically coupled to the current detecting module, one terminal of a third resistor is electrically coupled to the current detecting module, and another terminal of the third resistor is electrically coupled to a base terminal of the second transistor via a fourth resistor, a collector terminal of the second transistor is electrically coupled to the load; one terminal of a fifth resistor is electrically coupled to the base terminal of the second transistor via the fourth resistor, and another terminal of the fifth resistor is electrically coupled to a collector terminal of the third transistor; and a base terminal of the third transistor is electrically coupled to the MCU via a sixth resistor, and an emitter of the third transistor is grounded.

2. The power detecting circuit of claim 1, wherein the first transistor is an NPN-type transistor, the second transistor is a PNP-type transistor, and the third transistor is the NPN-type transistor.

3. A power detecting circuit for a power supply module, the power detecting circuit comprising:
- an alternating current (AC) power source configured to provide an AC voltage to the power supply module;
- a current detecting module electrically coupled to the power supply module and configured to detect an output current value of the power supply module;
- a micro control unit (MCU) electrically coupled to the current detecting module;
- a load coupled to the MCU; and
- a correcting circuit coupled to the MCU and configured to correct the output current value of the power supply module when the load is turned off;
- wherein the MCU is configured to calculate an output power value of the power supply module according to a corrected output current value and a preset output voltage value or a tested output voltage value of the power supply module;
- the correcting circuit comprises a first transistor, a second transistor, and a third transistor; a base terminal of the first transistor is electrically coupled to the MCU via a first resistor, a collector terminal of the first transistor is electrically coupled to the current detecting module via a second resistor, and an emitter terminal of the first transistor is grounded; an emitter terminal of the second transistor is electrically coupled to the current detecting module, one terminal of a third resistor is electrically coupled to the current detecting module, and another terminal of the third resistor is electrically coupled to a base terminal of the second transistor via a fourth resistor, a collector terminal of the second transistor is electrically coupled to a load; one terminal of a fifth resistor is electrically coupled to the base terminal of the second transistor via the fourth resistor, and another terminal of the fifth resistor is electrically coupled to a collector terminal of the third transistor; and a base terminal of the third transistor is electrically coupled to the MCU via a sixth resistor, and an emitter of the third transistor is grounded.

4. The power detecting circuit of claim 3, wherein the first transistor is an NPN-type transistor, the second transistor is a PNP-type transistor, and the third transistor is the NPN-type transistor.

* * * * *